United States Patent
Chang et al.

(10) Patent No.: US 8,963,569 B2
(45) Date of Patent: Feb. 24, 2015

(54) SEMICONDUCTOR CHIP PROBE AND THE CONDUCTED EME MEASUREMENT APPARATUS WITH THE SEMICONDUCTOR CHIP PROBE

(71) Applicant: National Applied Research Laboratories, Hsinchu (TW)

(72) Inventors: Yin-Cheng Chang, Hsinchu (TW); Da-Chiang Chang, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 80 days.

(21) Appl. No.: 13/921,973

(22) Filed: Jun. 19, 2013

(65) Prior Publication Data
US 2014/0292364 A1    Oct. 2, 2014

(30) Foreign Application Priority Data
Apr. 1, 2013    (TW) .............................. 102111740 A (51) Int. Cl.
   G01R 31/00    (2006.01)
   G01R 1/067    (2006.01)
(52) U.S. Cl.
   CPC .................................. *G01R 1/06761* (2013.01)
   USPC ............. 324/755.01; 324/754.07; 324/756.06
(58) Field of Classification Search
   None
   See application file for complete search history.

(56) References Cited

U.S. PATENT DOCUMENTS

| | | | | |
|---|---|---|---|---|
| 5,166,605 A | * | 11/1992 | Daum et al. | 324/750.18 |
| 5,786,701 A | * | 7/1998 | Pedder | 324/756.05 |
| 6,838,893 B2 | * | 1/2005 | Khandros et al. | 324/756.03 |

\* cited by examiner

*Primary Examiner* — Minh N Tang
(74) *Attorney, Agent, or Firm* — Juan Carlos A. Marquez; Bacon & Thomas PLLC (57) ABSTRACT

The present invention discloses a semiconductor chip probe for measuring conducted electromagnetic emission (EME) of a bare die and a conducted EME measurement apparatus with the semiconductor chip probe. The semiconductor chip probe comprises a substrate, a dielectric layer, an impedance unit, a measuring unit and a connection unit. The measurement apparatus comprises a semiconductor chip probe, a high frequency probe, a signal cable and a test receiver. The integrated passive component network designed and embedded inside the semiconductor chip probe forms the 1Ω or 150Ω impedance network. And the semiconductor chip probe is able to directly couple the EME conducted current or voltage from the test pin of the flipped chip under test to the test receiver for measurement.

19 Claims, 6 Drawing Sheets

SEMICONDUCTOR CHIP PROBE AND THE CONDUCTED EME MEASUREMENT APPARATUS WITH THE SEMICONDUCTOR CHIP PROBE

BACKGROUND OF THE INVENTION

1. Technical Field

The present invention relates to a semiconductor chip probe and a measurement apparatus with the semiconductor chip probe, and more particularly, to a semiconductor chip probe having a passive component network built therein and measuring a high-frequency electromagnetic emission (EME) conducted current or voltage of a flipped chip through direct coupling and a measurement apparatus with the semiconductor chip probe.

2. Description of Related Art

Problems arising from electromagnetic compatibility (EMC) have become increasingly important in detection of various semiconductor and electronic apparatuses. In the past, processing operations are mostly carried out at the hierarchy of terminal products or system modules or circuit boards for the problems and design modifications about the EMC. However, because currently the requirements on the EMC become increasingly higher and there are increasingly more high-frequency electronic products, it has become necessary to evaluate the problems about the EMC effect at the IC bare-die level of semiconductor chips.

International Electrotechnical Commission (IEC) has issued a series of standards for measurement of the EMC of integrated circuits (ICs), among which there is a series of measurement methods related to electromagnetic emission (EME): the standard IEC-61967. According to different propagation and emission paths of electromagnetic waves, the EME measurement methods may further be categorized into conduction methods and radiation methods, among which the 1 ohm ($\Omega$)/150$\Omega$ direct coupling measurement method belongs to the conduction EME measurement methods.

In 1$\Omega$ measurement, an interference current emission at a ground pin is measured through direct coupling, and the magnitude of the electromagnetic interference emission is evaluated through a radio-frequency (RF) current collected at an IC ground point. In 150$\Omega$ measurement, an interference voltage emission at an input/output (I/O) end or a power supply port is measured through direct coupling. In the 1$\Omega$/150$\Omega$ direct coupling measurement method, testing points are all connected to a test receiver of 50$\Omega$ through an impedance matching component. A user must design by himself a probe having an impedance matching network of 1$\Omega$ or 150$\Omega$ for measurement, and the probe is then connected to the test receiver through an output impedance of 50$\Omega$.

For all the measurement methods currently available, test of a pin is performed on a packaged IC on a printed circuit board (PCB), and the test result is provided as a product report or to the IC designer for evaluation of the EMC problems. However, due to the effect generated from the package is included in the characteristics of the packaged IC and the size of the probe used will generate a parasitic effect within the measurement frequency range 1 GHz of the standard measurement specifications, the accuracy of the measurement result is always degraded. The higher the operation frequency of the IC under test is, the more significant the parasitic effect will be and the lower the accuracy of the measurement result will be.

On the other hand, RF probes currently used can only transfer signals and do not allow an impedance matching component to be disposed therein, functions are limited in measuring the conducted EME.

Accordingly, an urgent need exists in the art to provide bare-die level conducted EME measurement probe and apparatus, which feature high reliability, high stability, a significantly reduced size, a significantly decreased cost and a built-in impedance matching component, to achieve a measurement system capable of testing a bare die.

SUMMARY OF THE INVENTION

The present invention discloses a semiconductor chip probe and a conducted EME (electromagnetic emission) measurement apparatus with the semiconductor chip probe. The semiconductor chip probe comprises a substrate, a dielectric layer, an impedance unit, a measuring unit and a connection unit. The measurement apparatus comprises a semiconductor chip probe, a RF probe, a signal cable and a test receiver. The passive components designed and embedded inside the semiconductor chip forms the 1$\Omega$ or 150$\Omega$ impedance network as a semiconductor chip probe. And the semiconductor chip probe is able to directly couple the EME conducted current or voltage from the test pin of the flipped chip under test to test receiver for measurement.

To achieve these and other effects, the present invention provides a semiconductor chip probe for measuring conducted electromagnetic emission (EME) of a bare die, the semiconductor chip probe comprises: a substrate; a dielectric layer, being formed on and covering a surface of the substrate; an impedance unit, being accommodated within the dielectric layer and consisting of a passive component network as well as a first metal wire, a second metal wire and a third metal wire that extend from the passive component network, wherein the third metal wire is electrically grounded; a measuring unit, having a test pad and a plurality of metal pads that expose the dielectric layer, wherein the test pad has a metal ball disposed thereon, the metal ball is electrically connected with a pad under test of a flipped chip and inputs a measurement signal from the pad under test, and the test pad is in signal connection with the first metal wire; and a connection unit, being formed by a signal pad and two ground pads that are disposed at two sides of the signal pad respectively, wherein the signal pad and the two ground pads are not contacted with each other and all expose the dielectric layer, the signal pad is electrically connected with the second metal wire, and the two ground pads are electrically grounded.

To achieve these and other effects, the present invention further provides a conducted EME measurement apparatus with a semiconductor chip probe, which comprises: a semiconductor chip probe; having: a substrate; a dielectric layer, being formed on and covering a surface of the substrate; an impedance unit, being accommodated within the dielectric layer and consisting of a passive component network as well as a first metal wire, a second metal wire and a third metal wire that extend from the passive component network, wherein the third metal wire is electrically grounded; a measuring unit, having a test pad and a plurality of metal pads that expose the dielectric layer, wherein the test pad has a metal ball disposed thereon, the metal ball is electrically connected with a pad under test of a flipped chip and inputs a measurement signal from the pad under test, and the test pad is in signal connection with the first metal wire; and a connection unit, being formed by a signal pad and two ground pads that are disposed at two sides of the signal pad respectively, wherein the signal pad and the two ground pads are not contacted with each other and all expose the dielectric layer, the signal pad is electrically connected with the second metal wire, and the two ground pads are electrically grounded; a high frequency probe, having three contact pins at one end thereof and an output end at the other end thereof, wherein the three contact pins are electrically connected with the signal pad and the two ground pads of the connection unit respectively and input the measurement signal from the connection unit, and the output end outputs the measurement signal; a signal cable, having an end electrically connected with the output end; and a test receiver, being electrically connected with the other end of the signal cable and configured to input the measurement signal from the signal cable and process or display the measurement signal.

Through implementation of the present invention, at least the following progressive effects can be achieved:

I. the chip probe features a simple manufacturing process and a low cost and is disposable;

II. the chip probe is capable of performing conducted EME measurement of bare-die;

III. the miniaturized chip probe has a particularly low parasitic effect, and thus has increased measurement accuracy and broadband characteristics; and IV. the chip probe has an integrated passive component network built therein, features a good impedance matching characteristic, and can perform 1Ω/150Ω conducted EME measurement through direct coupling.

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

As shown in FIG. 1 to FIG. 3 and FIG. 6, there is shown a semiconductor chip probe 100 for measuring conducted electromagnetic emission (EME) of a bare die according to an embodiment of the present invention, the semiconductor chip probe 100 comprises a substrate 10, a dielectric layer 20, an impedance unit 30, a measuring unit 40 and a connection unit 50. Because the semiconductor chip probe 100 is completely produced through a semiconductor process, and is a miniaturized integrated circuit (IC) which has a low production cost, the semiconductor chip probe 100 can be disposable.

The substrate 10 as shown in FIG. 1 to FIG. 3 and FIG. 6 is used to bear the dielectric layer 20, the impedance unit 30, the measuring unit 40 and the connection unit 50 of the semiconductor chip probe 100. The substrate 10 can be a glass substrate, a silicon substrate or a ceramic substrate.

As shown in FIG. 1 to FIG. 3 and FIG. 6, the dielectric layer 20 is formed on and covers a surface of the substrate 10, and is formed of a single dielectric substance or a composite dielectric substance. The dielectric layer 20 covers and protects the impedance unit 30, the measuring unit 40 and the connection unit 50, and exposes a part of the measuring unit 40 and the connection unit 50. The dielectric layer 20 can be the dielectric substance of a capacitor in the impedance unit 30.

As also shown in FIG. 1 to FIG. 3 and FIG. 6, the impedance unit 30 is accommodated within the dielectric layer 20. The impedance unit 30 consists of a passive component network 30' as well as a first metal wire 31, a second metal wire 32 and a third metal wire 33 that extend from the passive component network 30'. The first metal wire 31 is electrically connected with the measuring unit 40, the second metal wire 32 is electrically connected with the connection unit 50, and the third metal wire 33 is electrically grounded.

Figure 5A:
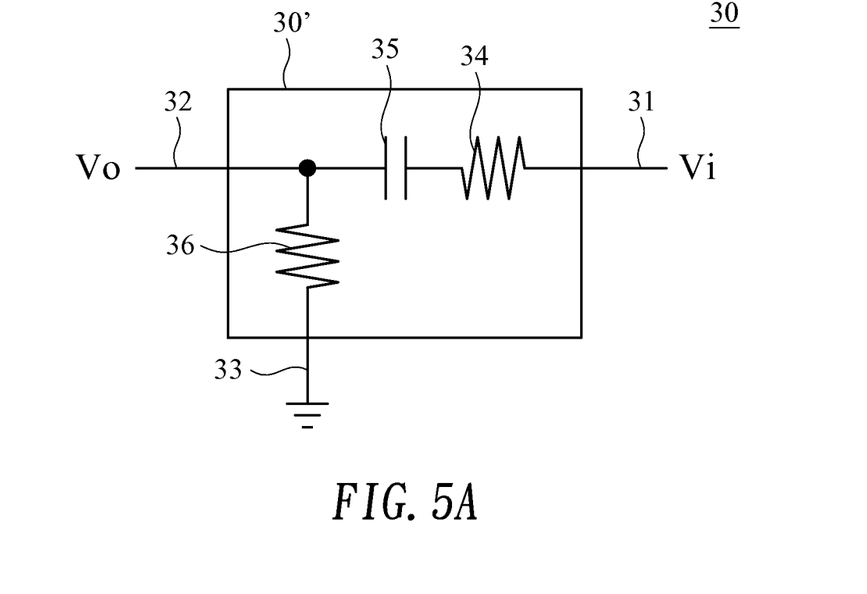
FIG. 5A is an equivalent circuit diagram of a 150 ohm probe according to an embodiment of the present invention.
Figure 5B:
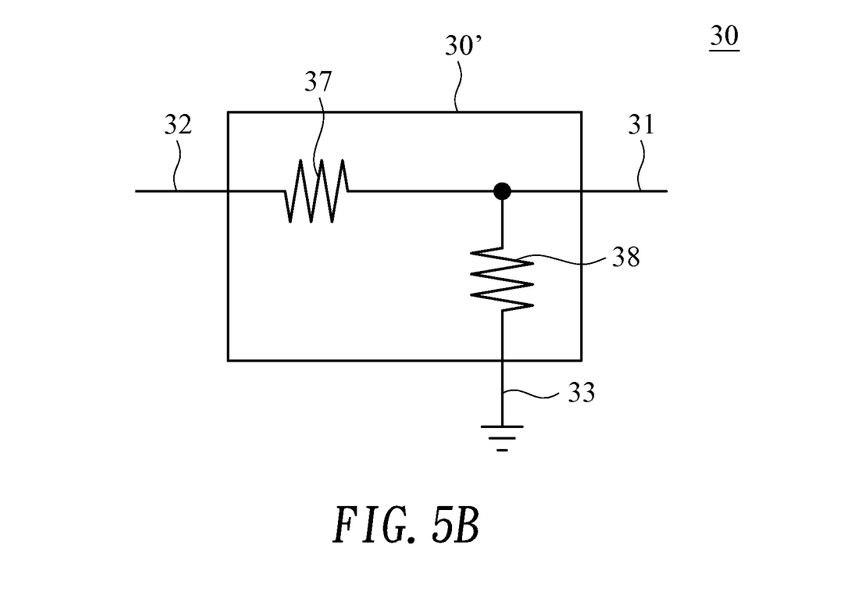
FIG. 5B is an equivalent circuit diagram of a 1 ohm probe according to an embodiment of the present invention.
Figure 6:
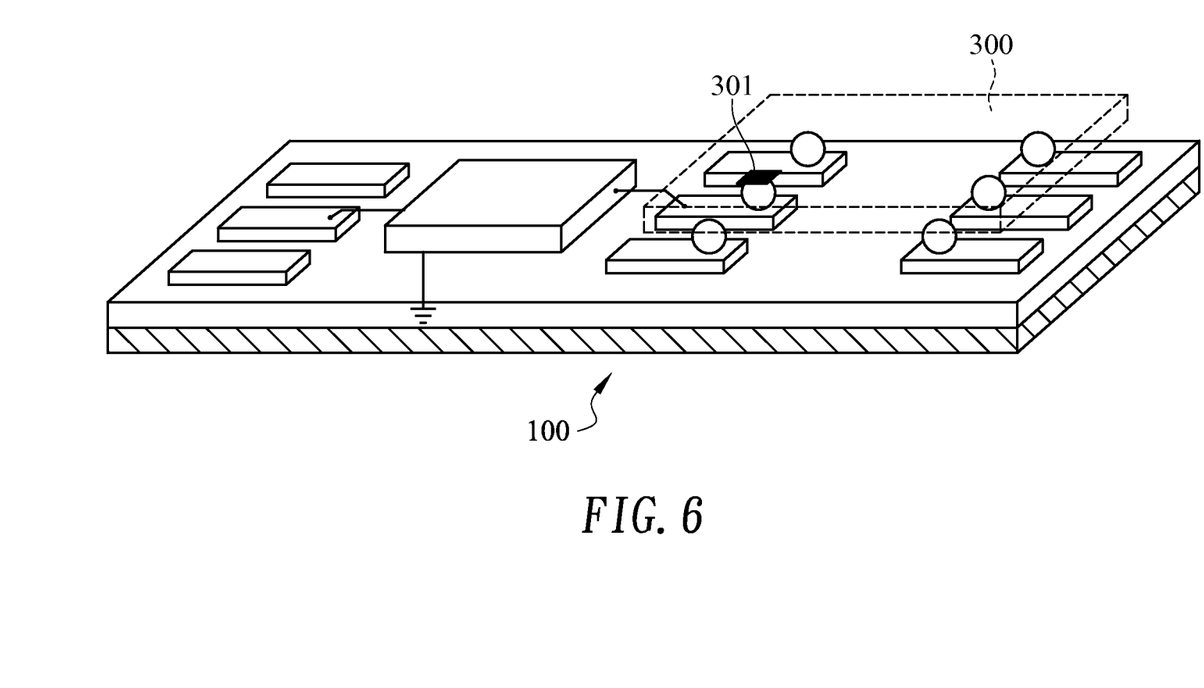
FIG. 6 is a schematic perspective view of a semiconductor chip probe according to an embodiment of the present invention which is electrically connected with a pad under test of a flipped chip.

As shown in FIG. 5A and FIG. 5B, there are shown equivalent circuits of an embodiment of the impedance unit 30 and the passive component network 30' thereof. The passive component network 30' as shown is actually a part of the integrated circuit of the semiconductor chip probe 100; that is, resistors or capacitors in the passive component network 30' are all built in the integrated circuit of the semiconductor chip probe 100.

As shown in FIG. 5A, there is shown an equivalent circuit of an embodiment of a probe of 150 ohm, with the passive component network 30' consisting of a first resistor 34 and a first capacitor 35 connected in series which are then connected in parallel with a second resistor 36. The first resistor 34 as shown in FIG. 5A may be selected as a resistor of 120 ohm, the first capacitor 35 may be selected as a capacitor of 6.8 nF, and the second resistor 36 may be selected as a resistor of 51 ohm. Thus, the semiconductor chip probe 100 becomes an impedance matching network and has an input impedance of 145±20 ohm. The semiconductor chip probe 100 thus built can perform high-frequency EME conducted voltage measurement on a flipped chip 300. Vi shown in FIG. 5A represents a voltage value of a pad under test 301 of the flipped chip 300, and Vo represents a voltage value measured and output by the probe of 150 ohm.

As shown in FIG. 5B, there is shown an equivalent circuit of an embodiment of a probe of 1 ohm, with the passive component network 30' consisting of a third resistor 37 and a fourth resistor 38 connected in parallel. The third resistor 37 may be selected as a resistor of 49 ohm, and the fourth resistor 38 may be selected as a resistor of 1 ohm. Thus, the semiconductor chip probe 100 becomes an impedance matching network and has an input impedance of 1 ohm. The semiconductor chip probe 100 can perform high-frequency EME conducted current measurement on the flipped chip 300.

As shown in FIG. 1 to FIG. 3 and FIG. 6, the measuring unit 40 has a test pad 41 and a plurality of metal pads 42, and the test pad 41 and the metal pads 42 expose the dielectric layer 20. The test pad 41 has a metal ball 43 disposed thereon, and the metal ball 43 is electrically connected with the pad under test 301 of the flipped chip 300 and inputs a measurement signal from the pad under test 301. The test pad 41 of the measuring unit 40 is electrically connected with the first metal wire 31 of the impedance unit 30, and outputs the measurement signal to the impedance unit 30. Because of the impedance is matched and the low parasitic effect of the small size of the semiconductor chip probe 100, measurement on the pad under test 301 of the flipped chip 300 has a high bandwidth characteristics and gives measurement results of high accuracy.

The metal ball 43 as shown in FIG. 1 to FIG. 4 and FIG. 6 may be a solder ball, a bump or a micro-bump that is made of tin, lead, silver or gold. The material of the metal ball 43 is mainly selected from those having a good electrical conductivity. Moreover, each of the metal pads 42 of the measuring unit 40 is further connected to a metal ball 43, which is electrically connected with a pad of the flipped chip 300 other than the pad under test 301, to support the flipped chip 300 and supply a DC power to the flipped chip 300 from a outside power source.

As shown in FIG. 1 to FIG. 3 and FIG. 6, the connection unit 50 is formed by a signal pad 51 and two ground pads 52 that are disposed at two sides of the signal pad 51 respectively. The signal pad 51 and the two ground pads 52 are not contacted with each other and all expose the dielectric layer 20, both of the ground pads 52 are electrically grounded, and the signal pad 51 is electrically connected with the second metal wire 32 and inputs the measurement signal from the second metal wire 32.

The connection unit 50 as shown in FIG. 1 to FIG. 3 and FIG. 6 is electrically arranged in the ground-signal-ground (GSG) connection way. For the GSG connection way, the signal pad 51 is disposed between the two grounded ground pads 52 to form a high-frequency transmission line in the coplanar waveguide (CPW) form during high-frequency signal transmissions, so the characteristic impedance can be controlled effectively to ensure the quality in the high-frequency signal transmissions.

Figure 1:
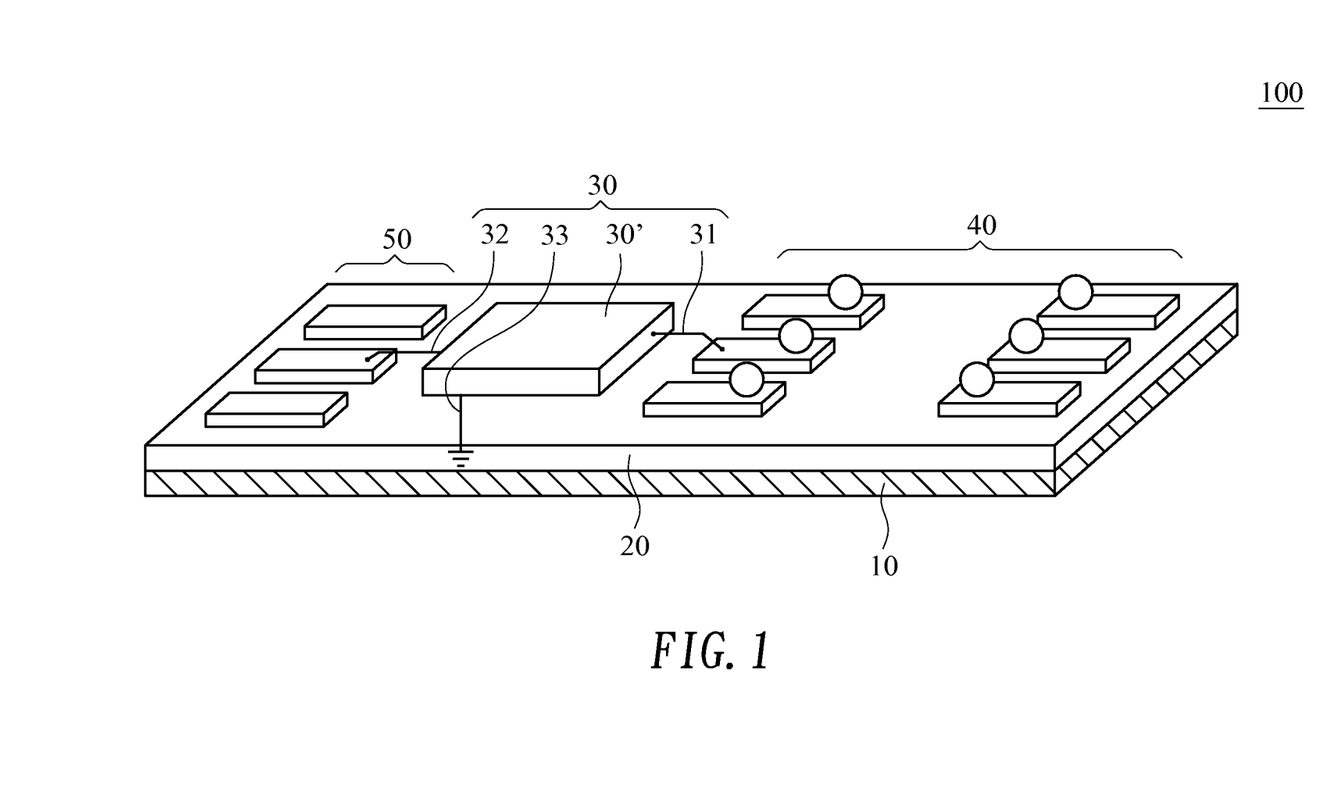
FIG. 1 is a perspective view of a semiconductor chip probe according to an embodiment of the present invention.
Figure 2:
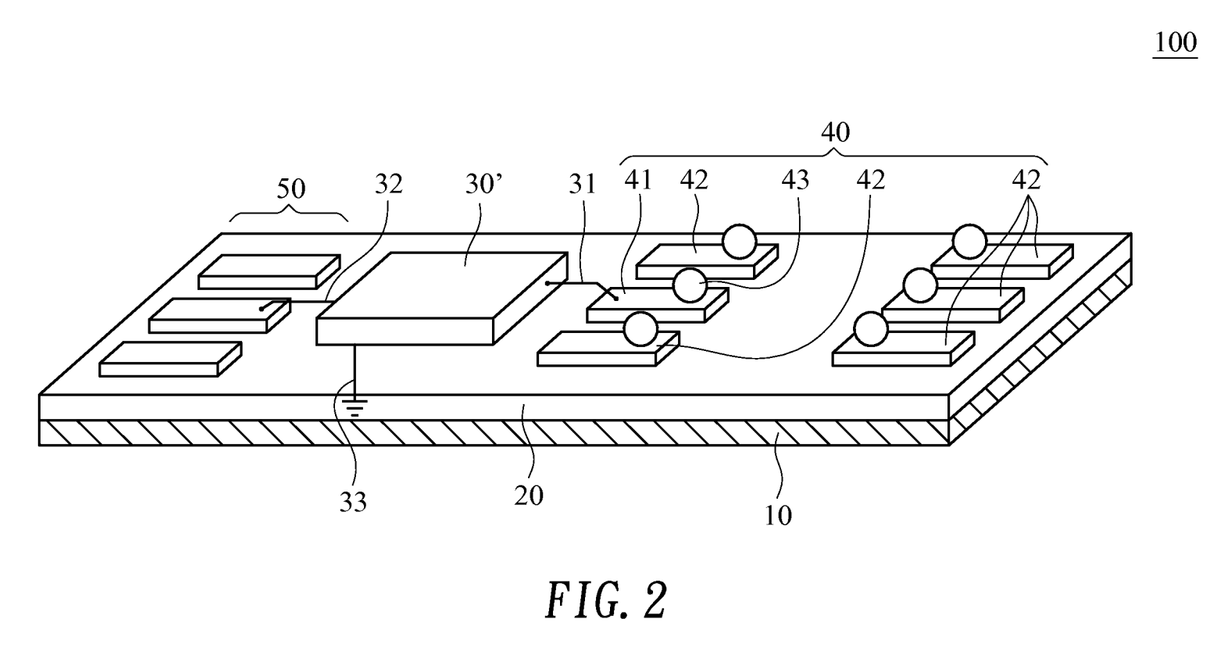
FIG. 2 is a perspective view of the semiconductor chip probe according to the embodiment of the present invention in which details of a measuring unit are denoted.
Figure 3:
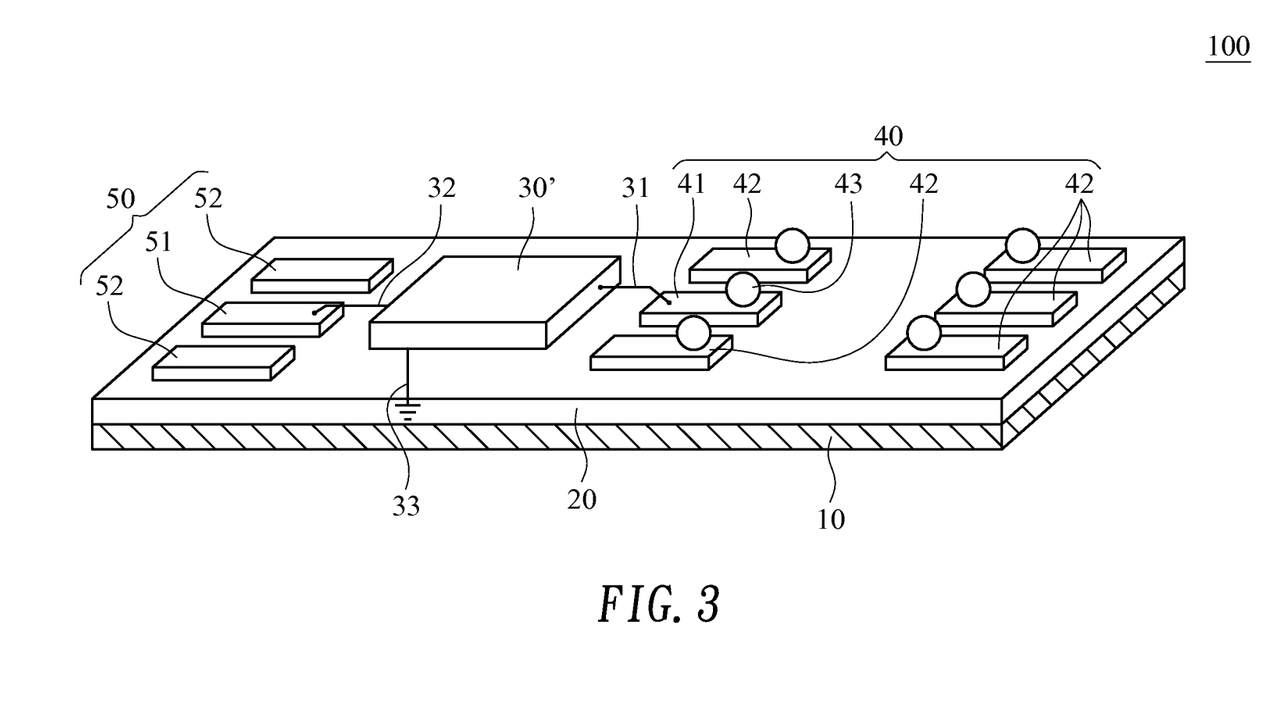
FIG. 3 is a perspective view of the semiconductor chip probe according to the embodiment of the present invention in which details of the measuring unit and a connection unit are denoted.
Figure 4:
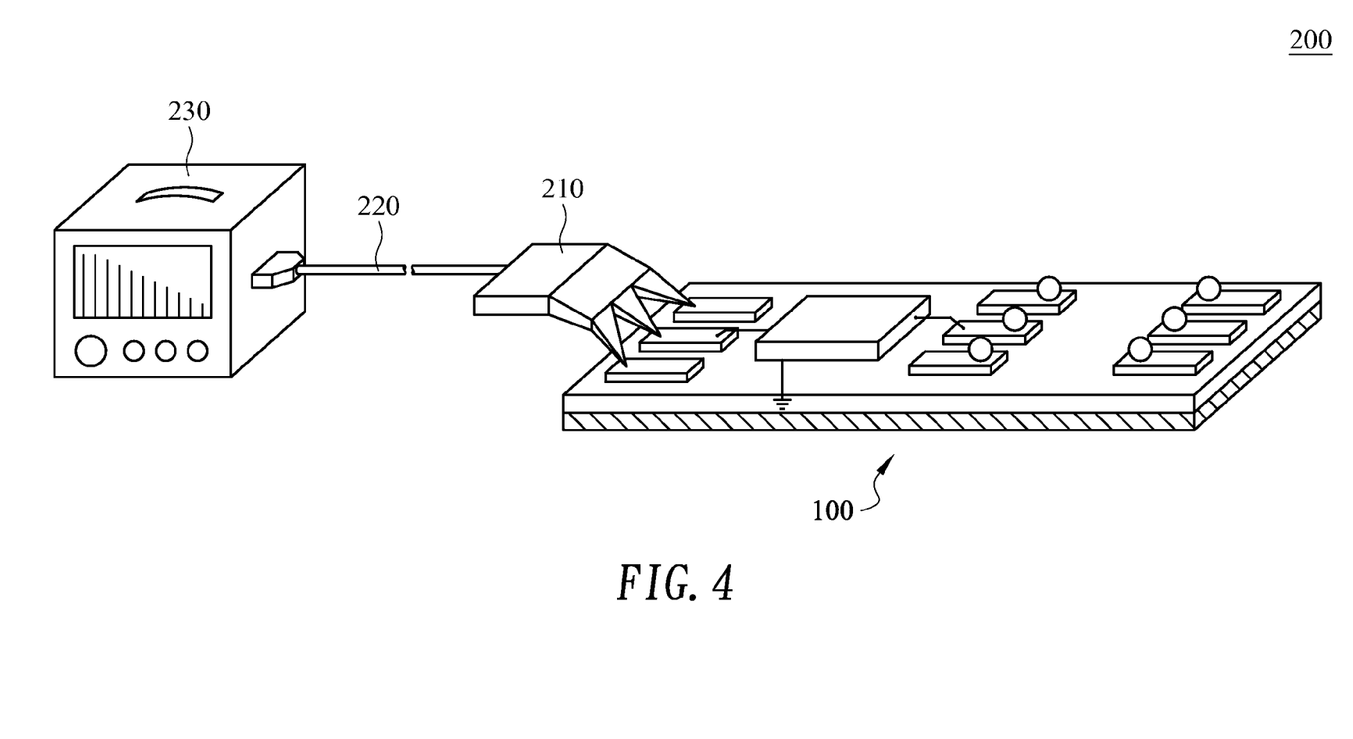
FIG. 4 is a perspective view of a measurement apparatus according to an embodiment of the present invention.

As shown in FIG. 4, there is shown a conducted EME measurement apparatus 200 with a semiconductor chip probe 100, the conducted EME measurement apparatus 200 comprises a semiconductor chip probe 100, a high frequency probe 210, a signal cable 220 and a test receiver 230. The semiconductor chip probe 100 is as the semiconductor chip probe 100 described in the embodiments above, and thus will not be further described herein.

The high frequency probe 210 as shown in FIG. 4 has three contact pins at one end thereof and an output end at the other end thereof, the three contact pins are electrically connected with the signal pad 51 and the two ground pads 52 of the connection unit 50 respectively and input the measurement signal from the connection unit 50, and the output end of the high frequency probe 210 outputs the measurement signal.

Further as shown in FIG. 4, the signal cable 220 has an end electrically connected with the output end of the high frequency probe 210, and the other end of the signal cable 220 is electrically connected with the test receiver 230. The signal cable 220 completely transmits to the test receiver 230 the measurement signal outputted from the high frequency probe 210. The signal cable 220 may be a coaxial cable.

Please also refer to FIG. 4, the test receiver 230, which is electrically connected with the signal cable 220, inputs the measurement signal from the signal cable 220, processes or displays the measurement signal. The test receiver 230 may be a spectrum analyzer or an oscilloscope, and most of the test receivers 230 may each comprise one display screen to display the measurement signal.

In the embodiments as shown in FIG. 1 to FIG. 4 and FIG. 6, electrical ground pins of the semiconductor chip probe 100, the high frequency probe 210, the signal cable 220, the test receiver 230 and the flipped chip 300 are all electrically connected with each other during actual measurement to ensure the accuracy of the measurement. Moreover, the semiconductor chip probe 100 can input a DC power supply from the outside and supply the DC power supply to the flipped chip 300 through the metal pads 42 and the metal balls 43.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A semiconductor chip probe for measuring conducted electromagnetic emission (EME) of a bare die, having:
a substrate;
a dielectric layer, being formed on and covering a surface of the substrate;
an impedance unit, being accommodated within the dielectric layer and consisting of a passive component network as well as a first metal wire, a second metal wire and a third metal wire that extend from the passive component network, wherein the third metal wire is electrically grounded;
a measuring unit, having a test pad and a plurality of metal pads that expose the dielectric layer, wherein the test pad has a metal ball disposed thereon, the metal ball is electrically connected with a pad under test of a flipped chip and inputs a measurement signal from the pad under test, and the test pad is in signal connection with the first metal wire; and
a connection unit, being formed by a signal pad and two ground pads that are disposed at two sides of the signal pad respectively, wherein the signal pad and the two ground pads are not contacted with each other and all expose the dielectric layer, the signal pad is electrically connected with the second metal wire, and the two ground pads are electrically grounded.

2. A conducted EME measurement apparatus with a semiconductor chip probe, comprising:
a semiconductor chip probe, having:
a substrate;
a dielectric layer, being formed on and covering a surface of the substrate;
an impedance unit, being accommodated within the dielectric layer and consisting of a passive component network as well as a first metal wire, a second metal wire and a third metal wire that extend from the passive component network, wherein the third metal wire is electrically grounded;
a measuring unit, having a test pad and a plurality of metal pads that expose the dielectric layer, wherein the test pad has a metal ball disposed thereon, the metal ball is electrically connected with a pad under test of a flipped chip and inputs a measurement signal from the pad under test, and the test pad is in signal connection with the first metal wire; and
a connection unit, being formed by a signal pad and two ground pads that are disposed at two sides of the signal pad respectively, wherein the signal pad and the two ground pads are not contacted with each other and all expose the dielectric layer, the signal pad is electrically connected with the second metal wire, and the two ground pads are electrically grounded;

a high frequency probe, having three contact pins at one end thereof and an output end at the other end thereof, wherein the three contact pins are electrically connected with the signal pad and the two ground pads of the connection unit respectively and input the measurement signal from the connection unit, and the output end outputs the measurement signal;

a signal cable, having an end electrically connected with the output end; and a test receiver, being electrically connected with the other end of the signal cable and configured to input the measurement signal from the signal cable and process or display the measurement signal.

3. The semiconductor chip probe of claim 1, wherein the passive component network consists of a first resistor and a capacitor connected in series which are then connected in parallel with a second resistor, the first resistor is a resistor of 120 ohm, the capacitor is a capacitor of 6.8 nF, the second resistor is a resistor of 51 ohm, and the semiconductor chip probe is an impedance matching network having an input impedance of 145±20 ohm, and performs high-frequency EME conducted voltage measurement on the flipped chip.

4. The semiconductor chip probe of claim 1, wherein the passive component network consists of a third resistor and a fourth resistor connected in parallel, the third resistor is a resistor of 49 ohm, the fourth resistor is a resistor of 1 ohm, and the semiconductor chip probe is an impedance matching network having an input impedance of 1 ohm, and performs high-frequency EME conducted current measurement on the flipped chip.

5. The semiconductor chip probe of claim 1, wherein the substrate is a glass substrate, a silicon substrate or a ceramic substrate.

6. The semiconductor chip probe of claim 1, wherein each of the metal pads is further connected to a metal ball, which is electrically connected with a pad of the flipped chip under test other than the pad under test, supports the flipped chip under test and supplies a direct current (DC) power supply to the flipped chip under test.

7. The semiconductor chip probe of claim 1, wherein the metal ball is a solder ball, a bump or a micro-bump that is made of tin, lead, silver or gold.

8. The semiconductor chip probe of claim 1, wherein the semiconductor chip probe is a disposable semiconductor chip probe.

9. The semiconductor chip probe of claim 1, wherein the dielectric layer is formed of a single dielectric substance or a composite dielectric substance.

10. The semiconductor chip probe of claim 2, wherein the passive component network consists of a first resistor and a capacitor connected in series which are then connected in parallel with a second resistor, the first resistor is a resistor of 120 ohm, the capacitor is a capacitor of 6.8 nF, the second resistor is a resistor of 51 ohm, and the semiconductor chip probe is an impedance matching network having an input impedance of 145±20 ohm, and performs high-frequency EME conducted voltage measurement on the flipped chip.

11. The semiconductor chip probe of claim 2, wherein the passive component network consists of a third resistor and a fourth resistor connected in parallel, the third resistor is a resistor of 49 ohm, the fourth resistor is a resistor of 1 ohm, and the semiconductor chip probe is an impedance matching network having an input impedance of 1 ohm, and performs high-frequency EME conducted current measurement on the flipped chip.

12. The semiconductor chip probe of claim 2, wherein the substrate is a glass substrate, a silicon substrate or a ceramic substrate.

13. The semiconductor chip probe of claim 2, wherein each of the metal pads is further connected to a metal ball, which is electrically connected with a pad of the flipped chip under test other than the pad under test, supports the flipped chip under test and supplies a direct current (DC) power supply to the flipped chip under test.

14. The semiconductor chip probe of claim 2, wherein the metal ball is a solder ball, a bump or a micro-bump that is made of tin, lead, silver or gold.

15. The semiconductor chip probe of claim 2, wherein the semiconductor chip probe is a disposable semiconductor chip probe.

16. The semiconductor chip probe of claim 2, wherein the dielectric layer is formed of a single dielectric substance or a composite dielectric substance.

17. The measurement apparatus of claim 2, wherein the signal cable is a coaxial cable.

18. The measurement apparatus of claim 2, wherein the test receiver is a spectrum analyzer or an oscilloscope.

19. The measurement apparatus of claim 2, wherein electrical ground pins of the semiconductor chip probe, the high frequency probe, the signal cable, the test receiver and the flipped chip under test are all electrically connected with each other.

* * * * *